United States Patent
Yoshida et al.

(10) Patent No.: US 6,656,860 B2
(45) Date of Patent: Dec. 2, 2003

(54) SYNTHETIC SILICA GLASS MEMBER, PHOTOLITHOGRAPHY APPARATUS AND PROCESS FOR PRODUCING PHOTOLITHOGRAPHY APPARATUS

(75) Inventors: Akiko Yoshida, Yamato (JP); Norio Komine, Sagamihara (JP); Hiroki Jinbo, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/993,564

(22) Filed: Nov. 27, 2001

(65) Prior Publication Data

US 2002/0082157 A1 Jun. 27, 2002

Related U.S. Application Data

(63) Continuation-in-part of application No. PCT/JP01/02567, filed on Mar. 28, 2001.

(30) Foreign Application Priority Data

Mar. 28, 2000 (JP) ..................................... P2000-089108

(51) Int. Cl.$^7$ .......................... C03C 3/06; C03C 15/00; C03B 19/06
(52) U.S. Cl. ........................... 501/54; 65/17.4; 65/17.6; 65/30.1; 355/53
(58) Field of Search ............................ 501/54, 37, 27, 501/14, 21; 65/17.4, 17.6, 30, 32; 355/53

(56) References Cited

U.S. PATENT DOCUMENTS

| 5,364,433 A | * | 11/1994 | Nishimura et al. | ........... 65/17.4 |
| 5,896,222 A | * | 4/1999 | Rosplock et al. | ........... 359/355 |
| 5,958,809 A | * | 9/1999 | Fujiwara et al. | ............... 501/54 |
| 6,087,283 A | * | 7/2000 | Jinbo et al. | .................... 501/54 |
| 6,143,676 A | * | 11/2000 | Ohashi et al. | ................. 501/54 |
| 6,174,830 B1 | | 1/2001 | Jinbo et al. | |

FOREIGN PATENT DOCUMENTS

| EP | 0 691 312 A1 | 1/1996 |
| EP | 1 001 314 A2 | 5/2000 |
| JP | A-7-187684 | 7/1995 |
| JP | 3069562 | 5/2000 |
| WO | WO 98/52879 | * 11/1998 |

OTHER PUBLICATIONS

V.S. Khotimchenko et al., "Determining the Content of Hydrogen Dissolved in Quartz Glass Using the Methods of Raman Scattering and Mass Spectrometry," J. Appl. Spectrose., vol. 46, pp. 632–635, 1987.

* cited by examiner

Primary Examiner—David Sample
Assistant Examiner—Elizabeth A Bolden
(74) Attorney, Agent, or Firm—Oliff & Berridge, PLC (57) ABSTRACT

A photolithography apparatus has an exposure light source for emitting exposure light with a wavelength of 400 nm or less, a reticle with a pattern original image formed therein, an illumination optical system for illuminating the reticle with exposure light, a projection optical system for projecting the pattern image from the reticle onto a photosensitive plate and an alignment system for aligning the reticle and the photosensitive plate. At least some of the synthetic silica glass members composing the illumination optical system, the projection optical system and the reticle consist of synthetic silica glass members which, upon $1\times10^4$ pulse irradiation with an ArF excimer laser at an energy density from 0.1 $\mu J/cm^2 \cdot p$ to 200 $mJ/cm^2 \cdot p$, have a loss factor no greater than 0.0050 $cm^{-1}$ at 193.4 nm measured after irradiation, a hydrogen molecule concentration from $1\times10^{16}$ molecules/$cm^3$ to $2\times10^{18}$ molecules/$cm^3$ and a loss factor no greater than 0.0020 $cm^{-1}$ before ultraviolet irradiation.

3 Claims, 10 Drawing Sheets

SYNTHETIC SILICA GLASS MEMBER, PHOTOLITHOGRAPHY APPARATUS AND PROCESS FOR PRODUCING PHOTOLITHOGRAPHY APPARATUS

RELATED APPLICATIONS

This is a Continuation-In-Part application of International Patent Application serial No. PCT/JP01/02567 filed on Mar. 28, 2001, now pending.

BACKGROUND OF THE INVENTION

1. Field of the Invention

The present invention relates to a synthetic silica glass member, to a photolithography apparatus and to a process for producing the photolithography apparatus. More specifically, it relates to a synthetic silica glass member for a photolithography apparatus used in an optical system with lenses, mirrors and the like for photolithography technology, in a specific wavelength range of no greater than 400 nm and preferably no greater than 300 nm, to a photolithography apparatus constructed using such optical members and to a process for producing the photolithography apparatus.

2. Related Background Art

Photolithography apparatuses known as "steppers" (projection exposure apparatuses) are conventionally used for photolithography techniques which accomplish exposure and transfer of intricate patterns of integrated circuits onto wafers of silicon or the like. The optical system of a stepper is constructed with an illumination optical system which uniformly irradiates light from a light source onto a reticle and a projection optical system which projects and transfers the integrated circuit pattern formed on the reticle onto a wafer at a ⅕ reduction, for example.

Recent higher integration of LSIs has required even shorter wavelengths for photolithography apparatus light sources, from g rays (436 nm) to i rays (365 nm) or even KrF (248.3 nm) or ArF (193.4 nm) excimer lasers. There has also been a corresponding demand for photolithography apparatuses allowing exposure with even finer minimum workability beam width. However, when the light source emits light with a wavelength range in the ultraviolet region, and particularly in the region below 250 nm, the light transmittance is too poor for practical use when employing lens materials used in illumination optical systems and projection optical systems designed for light with a longer wavelength region than i rays. Lens materials used in illumination optical systems and projection optical systems are therefore limited to silica glass and some crystal materials that exhibit high light transmittance.

When a silica glass member is used in the optical system of a photolithography apparatus, extremely high quality is required for exposure of the integrated circuit pattern with a large area at high resolution. For example, for a member with a relatively large diameter of about 200 mm, the refractive index distribution of the member must be on the order of no greater than $10^{-6}$. It is also necessary to reduce the birefringence, i.e. minimize internal strain of the member, and this improves the uniformity of the refractive index distribution and is also important for an the resolution of the optical system. Consequently, there have been strict limitations on silica glass members made of silica glass alone that can be used for photolithography apparatuses employing ultraviolet light from an excimer laser stepper as the light source.

In addition, silica glass members used for photolithography apparatuses using ultraviolet light as the light source must have high transmittance (small loss factor) in addition to the aforementioned conditions. This is because a very large number of lenses are provided in the illumination optical system or projection optical system of a photolithography apparatus to compensate for aberration, and the optical loss of each individual lens can lead to reduced transmittance of the apparatus as a whole.

Silica glass includes fused silica glass obtained by melting natural crystal powder and synthetic silica glass obtained by chemical synthesis, but synthetic silica glass is characterized by being of high purity with low metal impurities, and having high transmittance for ultraviolet light of a wavelength of 250 nm or smaller. Homogeneous synthetic silica glass with a large aperture can also be produced due to the nature of the production process.

SUMMARY OF THE INVENTION

Even with synthetic silica glass, however, the action of a high power ultraviolet beam or excimer laser beam produces a 260 nm absorption band due to structural defects known as NBOHCs (Non-Bridging Oxygen Hole Centers, having the structure ≡Si—O.) or a 215 nm absorption band due to structural defects known as E' centers (having the structure ≡Si., where ≡ is not a triple bond but represents bonding to 3 oxygen atoms, and.represents an unpaired electron), and transmittance in the ultraviolet region is significantly reduced as a result. Because the center wavelengths of these absorption bands are close to the oscillation wavelength of the KrF excimer laser or ArF excimer laser used as the light source of the stepper, the transmittance of the optical system is considerably reduced by light absorption. A large 215 nm absorption band is also sometimes produced even with low total ultraviolet beam irradiation (=low irradiation energy or a short irradiation time). Since the absorption band is usually produced at the initial stage of irradiation of an excimer laser, the absorption is referred to as initial irradiation absorption. Thus, not all synthetic silica glass can necessarily be used for lens members of such apparatuses, and therefore synthetic silica glass with low initial irradiation absorption is necessary in order to satisfactorily guarantee practical performance for the apparatus.

To date it has been independently confirmed that the desired properties for an optical member used in a photolithography apparatus employing an ArF excimer laser or the like with a wavelength of 200 nm or less as the light source are a low loss factor before irradiation with an ArF excimer laser beam (wavelength: 193.4 nm) and low transmittance reduction even with prolonged irradiation with an ArF excimer laser (i.e. low prolonged transmittance variation); however, it has been difficult to obtain silica glass members satisfying both of these properties, and therefore no photolithography apparatus has existed with an ArF excimer laser employing such a member as the light source.

It is an object of the present invention, which has been accomplished in light of these problems, to provide a synthetic silica glass member which can increase the transmittance of a photolithography apparatus employing an ArF excimer laser as the light source and thereby exhibit adequate properties for practical use, as well as a high-resolution photolithography apparatus employing it and a process for its production.

The present inventors investigated the relationship between the properties of silica glass and the degree of the initial irradiation absorption in order to elucidate the cause of the initial irradiation absorption of silica glass for ultraviolet light. As a result, it was found that when silica glass is synthesized in a reducing atmosphere for doping of hydrogen in order to achieve enhanced durability, providing an atmosphere that is more strongly reducing than necessary results in silica glass containing a high degree of the structural defect $\equiv$Si—H (which is easily cleaved by ultraviolet irradiation with low energy density to become an E' center) which is a cause of lower transmittance of the silica glass member, or in other words, that silica glass with a greater hydrogen molecule concentration tends to exhibit high initial irradiation absorption. It was found at the same time that silica glass containing virtually no hydrogen molecules exhibits reduced transmittance with prolonged irradiation with an ArF excimer laser.

Thus, the synthetic silica glass of the invention is a synthetic silica glass member used in a photolithography apparatus employing light in a wavelength range of 400 nm or less, wherein hydrogen molecules are present at a certain level and the $\equiv$Si—H concentration is lowered during synthesis by appropriately adjusting the hydrogen molecule concentration of the silica glass during synthesis in a reducing atmosphere, the member being characterized in that, upon $1 \times 10^4$ pulse irradiation with an excimer laser at an energy density from 0.1 $\mu$J/cm$^2$·p to 200 mJ/cm$^2$·p, the loss factor at 193.4 nm measured after irradiation (i.e. the initial irradiation absorption) is no greater than 0.0050 cm$^{-1}$, the hydrogen molecule concentration is from $1 \times 10^{16}$ molecules/cm$^3$ to $2 \times 10^{18}$ molecules/cm$^3$ and the loss factor before ultraviolet irradiation is no greater than 0.0020 cm$^{-1}$.

The photolithography apparatus of the invention is a photolithography apparatus comprising an exposure light source that emits light with a wavelength of 400 nm or less as the exposure light, a reticle with a pattern image formed therein, an illumination optical system that irradiates light outputted from the exposure light source onto the reticle, a projection optical system that projects the pattern image outputted from the reticle onto a photosensitive plate and an alignment system that positions the reticle and the photosensitive plate, wherein at least some of the synthetic silica glass members composing the illumination optical system, the synthetic silica glass members composing the projection optical system and the reticle (for example, the collimator lens, flyeye lens, condenser lens, projection lens, etc. in the described embodiment) consist of synthetic silica glass members characterized as described above.

By constructing all or some of the optical members of a photolithography apparatus (for example, the stepper 1 in the described embodiment) using synthetic silica glass members according to the invention, it is possible to ensure high transmittance and adequate properties for practical use even when the light source is an ArF excimer laser. The synthetic silica glass member has a hydrogen molecule concentration of $1 \times 10^{16}$ molecules/cm$^3$ to $2 \times 10^{18}$ molecules/cm$^3$ and a loss factor of no greater than 0.0020 cm$^{-1}$ before ultraviolet irradiation.

A hydrogen molecule concentration of less than $1 \times 10^{16}$ molecules/cm$^3$ results in greater reduction in transmittance with prolonged irradiation with an ArF excimer laser. On the other hand, synthesis under conditions with a hydrogen molecule concentration of greater than $2 \times 10^{18}$ molecules/cm$^3$ tends to result in a higher $\equiv$Si—H concentration as well and greater initial irradiation absorption, and a non-uniform hydrogen molecule concentration in the silica glass.

A photolithography apparatus constructed using a synthetic silica glass member with a loss factor of greater than 0.0020 cm$^{-1}$ before ultraviolet irradiation has low transmittance (throughput) for the optical system as a whole, and lower resolution is exhibited due to heating of the member upon irradiation with the laser or changes in the surface shape. In the case of a synthetic silica glass member with a loss factor (initial irradiation absorption) exceeding 0.0050 cm$^{-1}$ at 193.4 nm measured after irradiation with $1 \times 10^4$ pulse irradiation at an energy density of 0.1 $\mu$J/cm$^2$·p to 200 mJ/cm$^2$·p, a large variation in transmittance is exhibited when the laser is switched on or off, and therefore the photolithography apparatus employing it has a large light exposure variation.

The process for producing the photolithography apparatus of the invention comprises an ingot synthesizing step in which a synthetic silica glass ingot with a hydrogen molecule concentration of from $1 \times 10^{16}$ molecules/cm$^3$ to $2 \times 10^{18}$ molecules/cm$^3$ is synthesized; an ingot cutting step in which the synthetic silica glass ingot is cut to obtain a synthetic silica glass member of the prescribed shape and size; a loss factor measuring step for measurement of the loss factor of the synthetic silica glass member before ultraviolet irradiation and the loss factor at 193.4 nm after irradiation with an ArF excimer laser with $1 \times 10^4$ pulse irradiation at an energy density from 0.1 $\mu$J/cm$^2$·p to 200 mJ/cm$^2$·p, to obtain a synthetic silica glass member with a loss factor of no greater than 0.0020 cm$^{-1}$ before ultraviolet irradiation and a loss factor of no greater than 0.0050 cm$^{-1}$ at 193.4 nm; and an optical system constructing step in which the synthetic silica glass member obtained in the loss factor measuring step is used to construct at least some of the synthetic silica glass members composing the illumination optical system, the synthetic silica glass members composing the projection optical system and the reticle.

According to this production process, it is possible to obtain a high-resolution photolithography apparatus employing a synthetic silica glass member with a loss factor of no greater than 0.0020 cm$^{-1}$ before ultraviolet irradiation and a loss factor of no greater than 0.0050 cm$^{-1}$ at 193.4 nm.

According to the invention, the distribution range (variation width) is preferably small for the hydrogen molecule concentration value in the radial direction at any given point of the synthetic silica glass member. The radial direction is the direction along any desired plane in the member perpendicular to the direction of the incident irradiated beam. Specifically, for the hydrogen molecule concentration at the center of the member (geometrical center of gravity), the variation width V of the hydrogen molecule concentration at any desired point on the plane including this center preferably satisfies the condition represented by $-50\% \leq V \leq +50\%$, and more preferably satisfies the condition represented by $-20\% \leq V \leq +20\%$. Thus, with a small distribution range (variation width) for the hydrogen molecule concentration in the radial direction of the member, it is possible to achieve a stable exposure dose over a prolonged period without irregularity in the degree of reduction in transmittance at any point in the member in the radial direction of the member, even when the ArF excimer laser is irradiated thereon for a prolonged period.

As explained above, when the hydrogen molecule concentration exceeds $2 \times 10^{18}$ molecules/cm$^3$ the variation width of the hydrogen molecule concentration tends to be larger. In order to reduce the variation of the hydrogen molecule concentration, it is preferred to adjust the oxygen gas/hydrogen gas flow ratio to 0.25–0.40 for the total combustion gas (oxygen-containing gas and hydrogen-containing gas) ejected from the burner during the silica glass ingot synthesis step. If the flow ratio is within this range it will be possible to include the necessary number of hydrogen molecules in the silica glass to prevent reduced transmittance during prolonged irradiation of light, while also minimizing the degree of ≡Si—H structure which is a cause of initial irradiation absorption, and to thereby reduce the variation width for the hydrogen molecule concentration; in addition, since the various conditions for the ingot synthesis step such as the synthesis burner shape, the raw material flow, the oscillating pattern of the target holding the ingot, etc., are also factors determining the hydrogen molecule concentration in the ingot and its variation width, the ≡Si—H concentration, etc., appropriate adjustment of these conditions is preferred. For example, if the raw material flow is too high the center temperature of the flame falls, tending to result in easier hydrogen concentration distribution.

DESCRIPTION OF THE PREFERRED EMBODIMENTS

Figure 1:
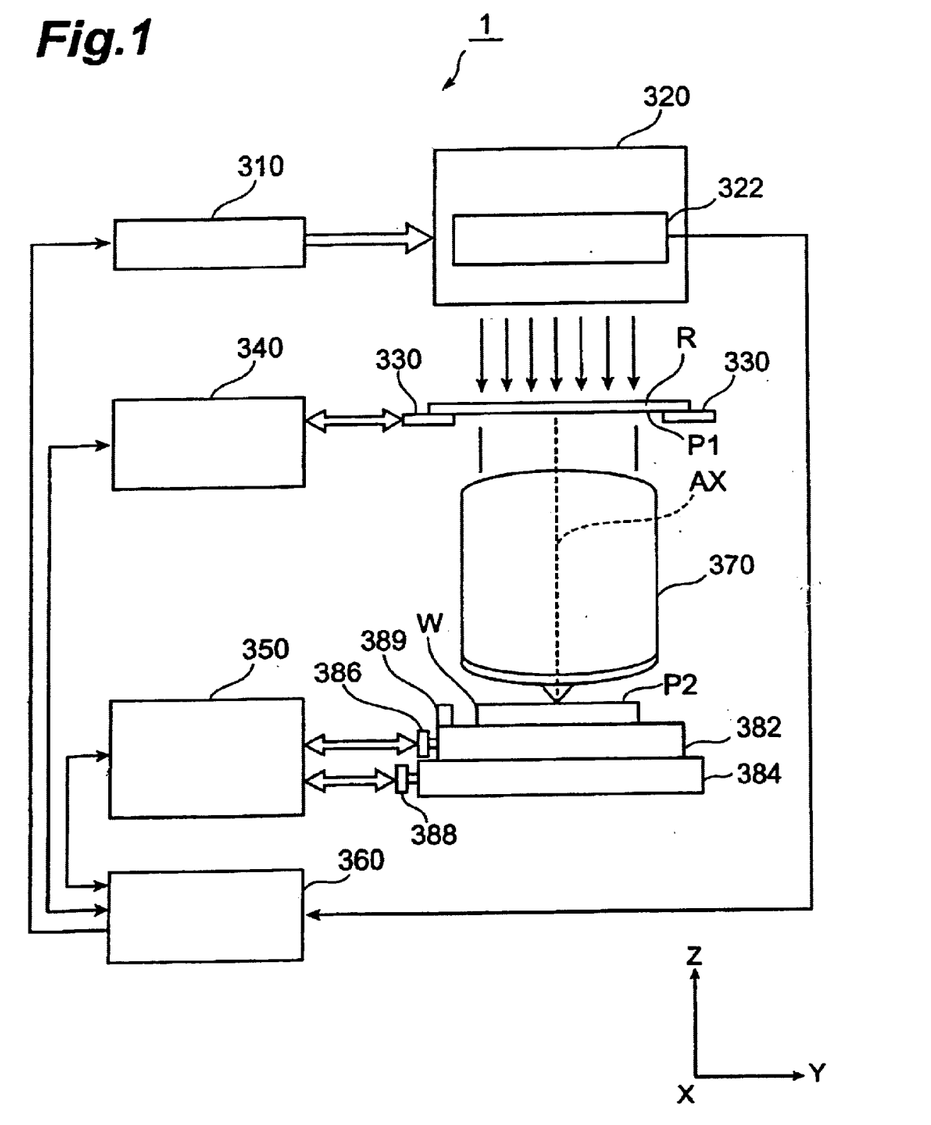
FIG. 1 is a general structural diagram showing an embodiment of the construction of a photolithography apparatus according to the invention.

A preferred embodiment of the present invention will now be explained with reference to the attached drawings. FIG. 1 is a general structural diagram showing an embodiment of a photolithography apparatus (stepper 1) according to the invention. In FIG. 1, the Z direction is the direction parallel to the optical axis of the projection optical system 370, the Y direction is the direction in the plane of the paper and perpendicular to the Z direction, and the X direction is the direction perpendicular to the paper surface and the Z direction.

The stepper 1 shown in FIG. 1 is constructed with an exposure light source 310 that emits light primarily with a wavelength of 400 nm or less as the exposure light, a reticle R with a pattern image formed therein, an illumination optical system 320 that irradiates light outputted from the exposure light source 310 onto the reticle R, a projection optical system 370 that projects the pattern image outputted from the reticle R onto a wafer (photosensitive plate) W at a reduction of ¼ or ⅕ and an alignment system 322 that positions the reticle R and the wafer W. Also, at least some of the synthetic silica glass members composing the illumination optical system 320 (for example, the collimator lens, flyeye lens, condenser lens, etc.), the synthetic silica glass members composing the projection optical system 370 (for example, reducing projection lens, etc.) and the reticle R consist of synthetic silica glass members according to the invention.

In other words, all or some of the synthetic silica glass members (including other lens and mirror members not shown here) such as the collimator lens, flyeye lens, condenser lens, projection lens, etc. are characterized in that upon $1 \times 10^4$ pulse irradiation at an energy density from 0.1 $\mu J/cm^2 \cdot p$ to 200 $mJ/cm^2 \cdot p$, the loss factor at 193.4 nm measured after irradiation is no greater than 0.0050 $cm^{-1}$.

A synthetic silica glass member characterized in such a manner is obtained from a material with a hydrogen molecule concentration from $1 \times 10^{16}$ molecules/$cm^3$ to $2 \times 10^{18}$ molecules/$cm^3$ and a loss factor before ultraviolet irradiation of no greater than 0.0020 $cm^{-1}$ (see the examples and comparative examples which follow).

The wafer W is placed on a leveling stage (not shown) and the leveling stage is situated on a Z stage 382 which is finely adjustable in the optical axis direction (Z direction) of the projection optical system by a driving motor 386. The Z stage 382 is placed on an XY stage 384 which can move in the two-dimensional (XY) direction in a step-and-repeat system driven by a driving motor 388. The reticle R is placed on a reticle stage 330 which is movable in two dimensions within the horizontal plane.

The exposure beam emitted from the exposure light source 310 is directed parallel to a collimator lens (not shown) in the illumination optical system 320 and the beam intensity is rendered uniform by a flyeye lens (not shown), after which it is condensed by a condenser lens (not shown) and reaches the reticle R. The light that has passed through the reticle R is condensed by a projection lens (not shown) in the projection optical system 370 and reaches the wafer W, and this reduces the integrated circuit pattern formed on the reticle R for exposure of the wafer W.

The exposure beam from the exposure light source 310 thus uniformly irradiates the pattern formed on the reticle R through the illumination optical system 320, so that the pattern image of the reticle R is transferred by exposure onto the shot area of the wafer W by the projection optical system 370. The exposure beam may be an exposure beam with a wavelength of 248 nm (KrF excimer laser), 193 nm (ArF excimer laser) or 157 nm ($F_2$ laser).

Upon completion of transfer exposure of the reticle R pattern onto one shot area of the wafer W, the XY stage 384 is moved by stepping so that the next shot area of the wafer W is aligned with the exposure region of the projection optical system 370. The two-dimensional position of the leveling stage on which the wafer W is placed is constantly monitored at a resolution of about 0.01 $\mu m$, for example, by measurement of the distance from a mobile mirror 389 anchored on the leveling stage using an interferometer (not shown), and the output of the laser interferometer is fed to the stage control system 350.

The reticle R is positioned on the reticle stage 330 so that the center of the transfer pattern on the reticle R is aligned with the optical axis AX of the projection optical system. The positioning of the reticle R is accomplished using a plurality of reticle alignment marks (reticle marks) provided near the outer periphery of the reticle R. Two types of reticle marks are provided: reticle marks for positioning in the X direction and reticle marks for positioning in the Y direction. The alignment system 322 uses an exposure beam extracted by splitting part of the exposure beam from the exposure light source 310 as a reference beam (alignment beam). The alignment system 322 provides one beam at the position of each reticle alignment mark.

The reference beams that have passed through the illumination optical system 320 are incident to the reticle marks provided outside the pattern area of the reticle R. The reticle marks consist of, for example, triangular transparent windows formed on non-transparent sections surrounding the pattern. When an alignment beam is reflected at the reticle mark section it reenters the alignment system 322. The portion of the alignment beam that has passed through the reticle mark passes through the projection optical system 370 and is incident onto substrate alignment marks (wafer marks) formed around each shot area on the wafer W. The wafer marks need not be provided surrounding each shot area but may be provided only at prescribed positions of the wafer, for example, on the peripheral region of the wafer. Two types of wafer marks are also provided: wafer marks for positioning in the X direction and wafer marks for positioning in the Y direction, corresponding to the reticle marks. Reflected light from the wafer marks takes the opposite path from the incident light, and it reenters the alignment system 322 through the projection optical system 370 and the reticle marks.

Thus, the alignment system 322 detects the relative positioning of the reticle R and the wafer W by inputted reflection of the alignment beam from the reticle R and wafer W. The output from the alignment system 322 is supplied to the main control system 360. Then, by supplying the output from the main control system 360 to a reticle exchange system 340 and stage control system 350, it is possible to adjust the spatial positioning of the reticle R and wafer W. As a result, it is possible to maintain high superposition precision between the pattern formed on each shot area of the wafer W and the pattern image of the reticle R which is transferred by exposure. The illumination optical system 320 uniformly illuminates the reticle R in a slit shape as the object of irradiation. The projection optical system 370 is situated between the surface P1 of the reticle R and the surface P2 of the wafer W.

By thus providing a projection optical system 370, illumination optical system 320 and/or reticle R composed of optical glass members according to the invention, it is possible to obtain a stepper 1 with low exposure light variation and high resolution.

A process for producing a photolithography apparatus according to the invention will now be explained. As mentioned above, the process for producing a photolithography apparatus according to the invention mainly comprises an ingot synthesizing step, an ingot cutting step, a loss factor measuring step and an optical system constructing step.

Figure 2:
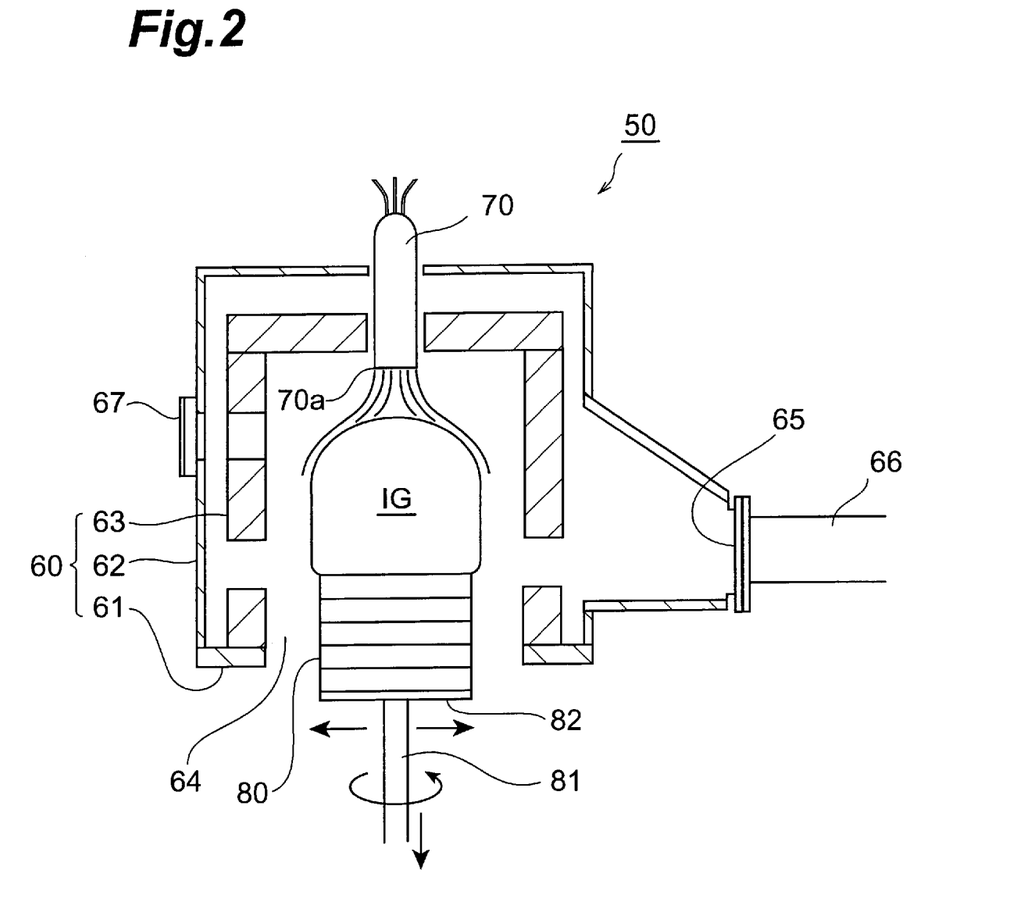
FIG. 2 is a general cross-sectional view showing an embodiment of a production apparatus for synthetic silica glass according to the invention.

First, the ingot synthesizing step will be explained. In the ingot synthesizing step there is synthesized a synthetic silica glass ingot with a hydrogen molecule concentration of $1 \times 10^{16}$ molecules/cm$^3$ to $2 \times 10^{18}$ molecules/cm$^3$. FIG. 2 shows a an embodiment of a production apparatus for a synthetic silica glass ingot from which a synthetic silica glass member of the invention is prepared. As shown in FIG. 2, this synthetic silica glass production apparatus 50 comprises a furnace 60, a burner 70 situated at the top of the furnace 60, and a target 80 provided below the burner 70 in the furnace space 64 formed inside the furnace 60.

The furnace 60 is constructed with a refractory body 63 inside a furnace frame 62 provided on a hearth plate 61, and the burner 70 is provided through the top of the furnace frame 62 and refractory body 63. The burner 70 has a multitube structure which will be explained later, and its expelling end 70a is directed downward into the furnace space 64. The target 80 is composed of a plurality of non-transparent silica glass plates stacked one upon the other, with the uppermost surface set on the top side of a horizontal disk 82 provided on a vertically extending support rod 81, facing the expelling end 70a of the burner 70. In the furnace frame 62 there is formed an discharge outlet 65 whereby exhaust gas such as HCl which is generated in the furnace 60 during synthesis of the silica glass is discharged out of the furnace 60, and a discharge conduit 66 in communication with the outside air is connected to the discharge outlet 65. A window 67 is provided in the outer wall of the furnace 60 to allow observation of the furnace space 64.

Figure 3:
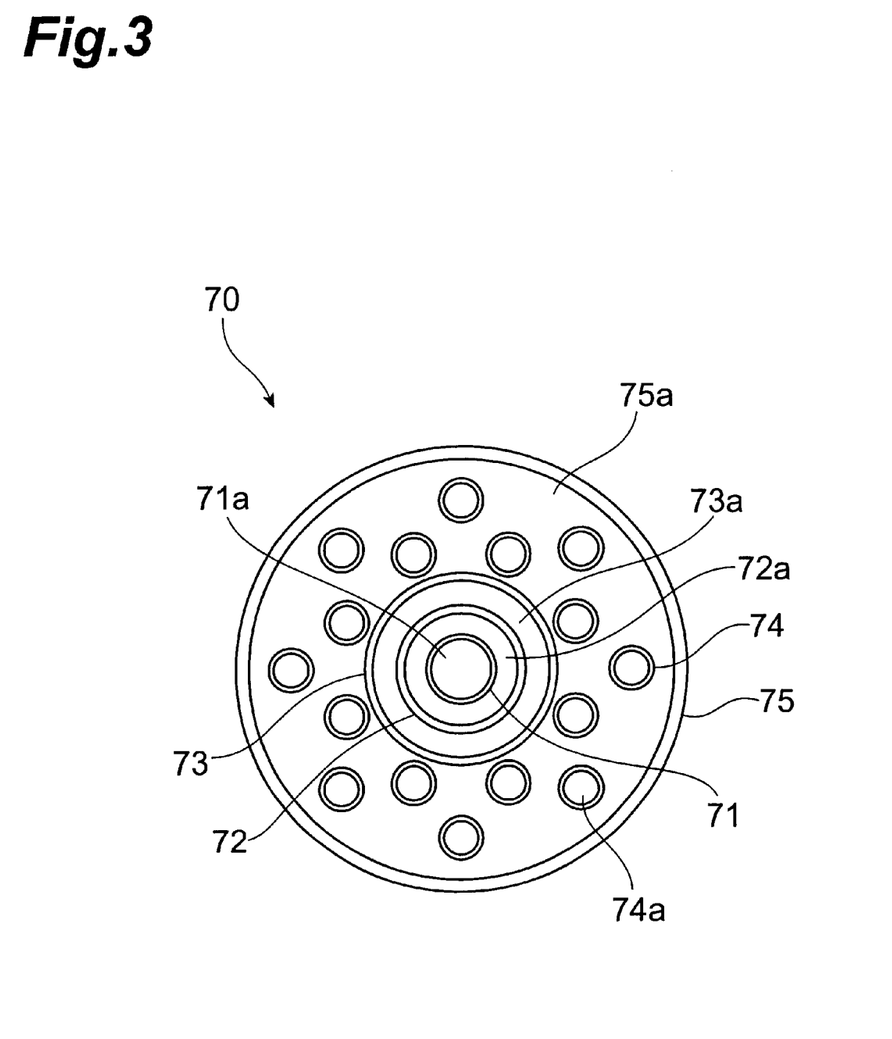
FIG. 3 is a schematic view of the burner of the production apparatus shown in FIG. 2 as seen from the exhaust nozzle side.

FIG. 3 shows the burner 70 from an angle facing the expelling end 70a, and a raw material expelling tube 71, oxygen/hydrogen expelling tubes 72, 73 an oxygen expelling tube 74 and a hydrogen expelling tube 75 are provided in that order from the center. The raw material expelling tube 71 is positioned at the center of the burner 70, and a silicon compound such as silicon tetrachloride ($SiCl_4$) as the raw material and a carrier gas (normally oxygen gas) for dilution are discharged from the inner space 71a. The two oxygen/hydrogen expelling tubes 72, 73 are arranged concentrically surrounding the raw material expelling tube 71, and combustion gases including oxygen gas and hydrogen gas are discharged from the respective inner spaces 72a, 73a. The plurality of oxygen expelling tubes 74 are positioned outside of the oxygen/hydrogen expelling tube 73, and oxygen is discharged from their respective inner spaces 74a. A hydrogen discharge tube 75 is positioned concentrically with the raw material expelling tube 71 and the oxygen/hydrogen expelling tubes 72, 73 in a manner surrounding the oxygen expelling tubes 74, and hydrogen gas is discharged from its inner space 75a. The oxygen gas and hydrogen gas are discharged through separate expelling tubes in this manner so that the gases react uniformly during the silica glass synthesis.

The silica glass synthesis is accomplished by expellinging the raw material, oxygen and hydrogen from the burner 70 toward the top surface of the target 80 while burning them. This causes the silicon tetrachloride to react with the oxygen and hydrogen (hydrolysis), and the synthesized silica glass powder accumulates on the target 80 and vitrifies to form a synthetic silica glass ingot IG. For an overall uniform composition of the produced ingot IG, the support rod 81 is driven to rotate the target 80 at a prescribed speed in the axial direction while vibrating at a prescribed time interval in the horizontal direction. Also, the entire target 80 is pulled downward at a prescribed speed during production in order to constantly maintain a fixed distance between the top end of the ingot IG and the expelling end 70a of the burner 70.

A synthetic silica glass ingot is produced in this manner, and since hydrogen molecules are introduced during the synthesis and are released during heat treatment, the hydrogen molecule concentration of the produced synthetic silica glass can be controlled by the synthesis conditions (for example, the proportion of oxygen gas and hydrogen gas supplied from the burner 70) and the heat treatment conditions (for example, conducting or not conducting a heat treatment step). The various conditions are therefore modified so that the ingot has a hydrogen molecule concentration of $1 \times 10^{16}$ molecules/cm$^3$ to $2 \times 10^{18}$ molecules/cm$^3$. The hydrogen molecule concentration of the resulting synthetic silica glass ingot can be confirmed by Raman spectroscopy or the like.

Once the synthetic silica glass ingot with the prescribed hydrogen molecule concentration has been obtained in this manner, the synthetic silica glass ingot is subjected to heat treatment before being conveyed to the ingot cutting step described later. As an example of such heat treatment there may be mentioned a step of holding the produced ingot at a fixed temperature for a prescribed period of time and then lowering the temperature at a prescribed temperature-lowering rate and allowing it to cool.

The ingot cutting step will now be explained. The ingot cutting step is a step in which, after the aforementioned heat treatment, the synthetic silica glass ingot is cut to obtain a synthetic silica glass member with the prescribed shape and size. First, a lump of a size corresponding to the size of the synthetic silica glass member to be fabricated is cut out from the ingot and subjected to grinding. It is then finely polished with $SiO_2$ or the like for finishing into a synthetic silica glass member with the prescribed dimensions.

Once the synthetic silica glass member with the prescribed dimensions and the prescribed composition (hydrogen molecule concentration of $1 \times 10^{16}$ molecules/cm$^3$ to $2 \times 10^{18}$ molecules/cm$^3$) is obtained in this manner, it is conveyed to the loss factor measuring step.

In the loss factor measuring step, the lost factor is first measured before ultraviolet irradiation. The portion with a loss factor of no greater than 0.0020 cm$^{-1}$ before ultraviolet irradiation is extracted from the synthetic silica glass member with the aforementioned hydrogen molecule concentration.

An example of a method of measuring the loss factor of a synthetic silica glass member before ultraviolet irradiation will now be explained. This explanation will concern a case of measuring the transmittance of an evaluation sample M (thickness Lo) composed of an optical member for ultraviolet use, using a commercially available spectrophotometer.

Figure 4:
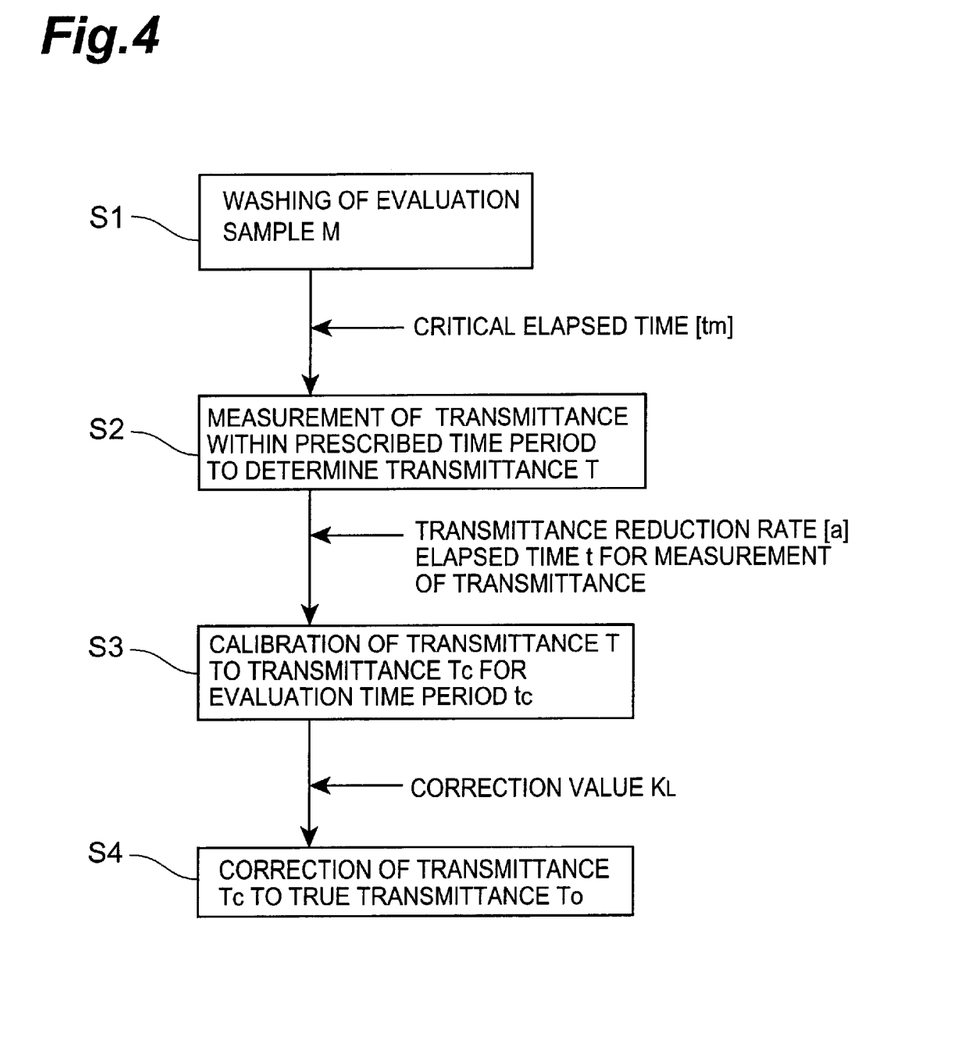
FIG. 4 is a flow chart showing the procedure for a transmittance measuring method.

The transmittance measuring method used here, as shown in FIG. 4, comprises the following procedure: a first step of cleaning the evaluation sample M (including a drying step) (S1), a second step of measuring the transmittance within a prescribed time period and determining the transmittance T (S2), a third step of calibrating the obtained transmittance T to the transmittance Tc for the evaluation time tc (S3) and a fourth step of correcting the transmittance Tc for the evaluation time to the true transmittance To (S4). This procedure requires determining in advance the transmittance reduction rate [a] and critical elapsed time [tm] corresponding to the material and thickness (=Lo) of the evaluation sample M, as well as the correction value $K_L$ for the spectrophotometer.

Figure 5:
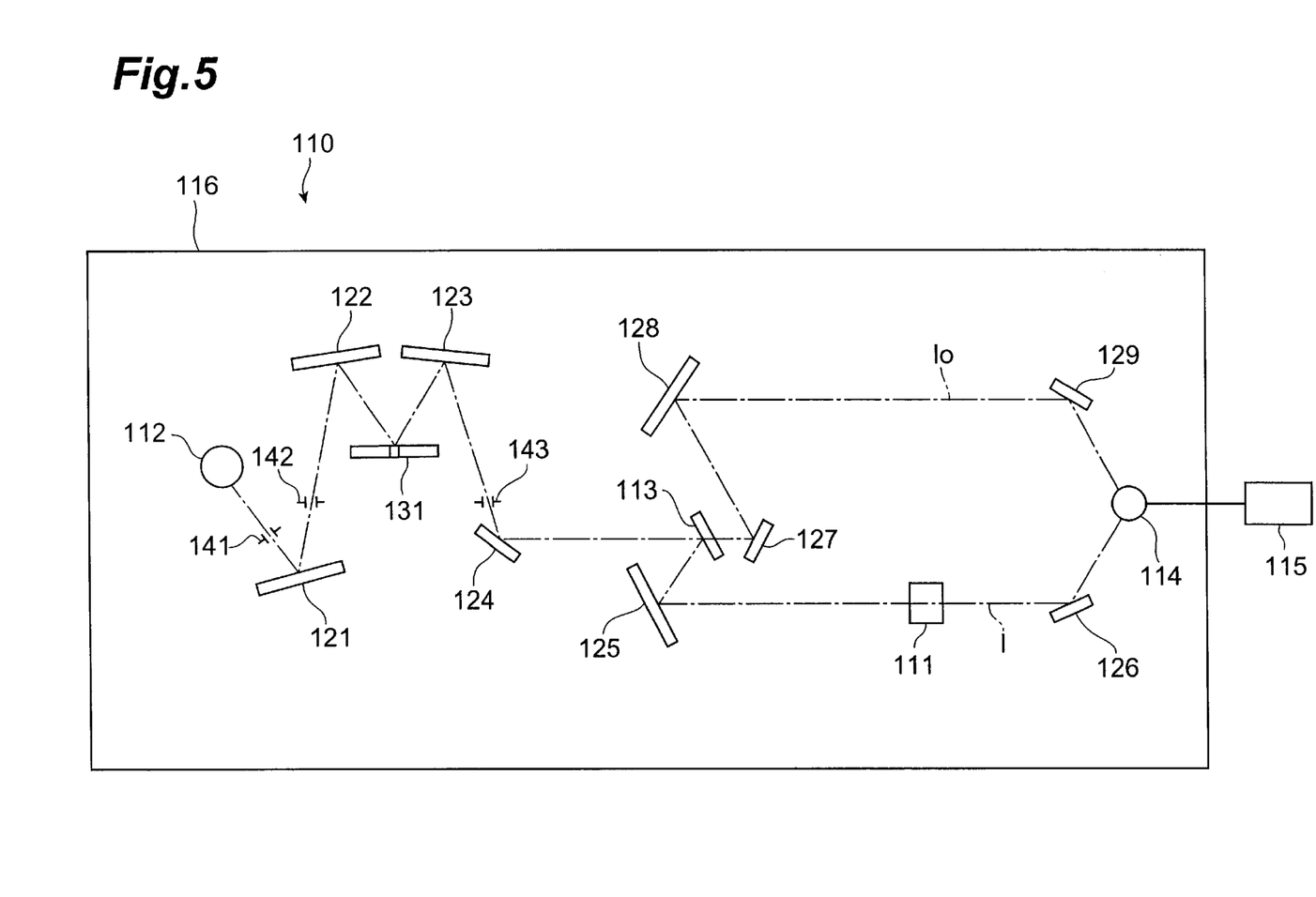
FIG. 5 is a general structural diagram of a spectrophotometer used for transmittance measurement.

First, the spectrophotometer used for the transmittance measurement will be explained. FIG. 5 shows an example of a construction of a commercially available spectrophotometer. For measurement of the transmittance of an object 111 using the spectrophotometer 110, the object 111 is placed between a mirror 125 and a mirror 126 and irradiated with a beam (ultraviolet light) from a light source 112. The beam from the light source 112 enters a mirror 121 through a slit 141. The beam reflected at the mirror 121 passes through a slit 142 and enters a diffraction grating 131 through a mirror 122. The primary diffraction beam is reflected by a mirror 123 and enters a mirror 124 through a slit 143. The beam reflected by the mirror 124 then enters a mirror 125 or a mirror 127 through a chopper mirror 113. The beam (measuring beam) reflected by the mirror 125 enters the object 111. The beam (transmitted beam) that has passed through the object 111 enters a detector 114 by way of a mirror 126. Meanwhile, the beam (reference beam) reflected by the mirror 127 enters the detector by way of mirrors 128, 129. The transmitted beam and reference beam received by the detector 114 are separated by a processor 115 and the transmitted beam intensity I and reference beam intensity Io are determined. The ratio I/Io is used to calculate the transmittance of the object 111. All the members of the apparatus except for the processor 115 are covered by a sealed chamber 116 which is nitrogen purged during the transmittance measurement.

The procedure for determining the parameters of the transmittance reduction rate [a] and critical elapsed time [tm] corresponding to the material and thickness (=Lo) of the evaluation sample M will now be explained. First, a calibration sample is prepared of the same material as the evaluation sample M and with the same thickness (=Lo). It is then cleaned (and dried), after which the procedure of measuring the transmittance using the spectrophotometer 110 is repeated a plurality of times while changing the elapsed time for the transmittance measurement (time elapsed after completion of cleaning). The results are then plotted on a coordinate graph with elapsed time on the horizontal axis and transmittance on the vertical axis, to prepare a first plot graph.

Figure 6:
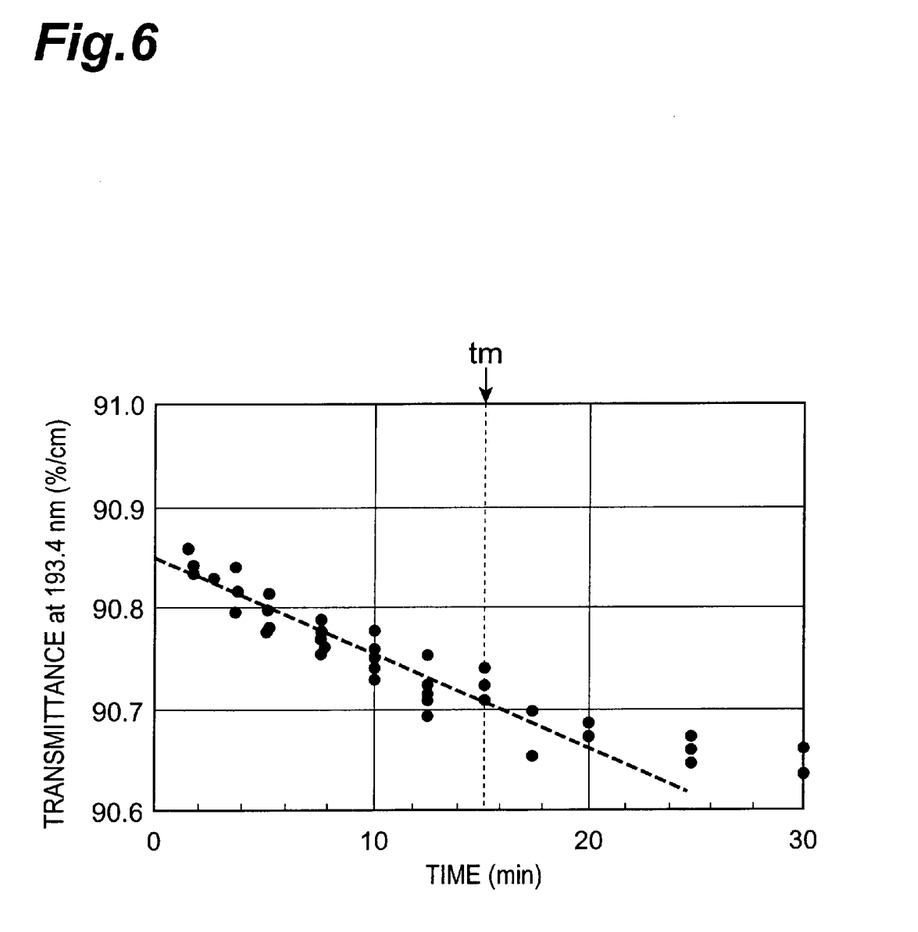
FIG. 6 is a graph showing an example of change in the transmittance of a calibration sample with time after completion of cleaning.

The first plot graph obtained in this manner represents the change in transmittance with time for the calibration sample, and the plot sequence can be fitted to a line from completion of cleaning to a given time (as shown in FIG. 6, for example). The line declines gradually as the elapsed time increases (i.e. it has a negative slope). The slope is calculated as the transmittance reduction rate [a] (%/min), while the critical elapsed time that can be fitted to the line is read as the critical elapsed time [tm] (minutes). The transmittance reduction rate [a] and critical elapsed time [tm] for the evaluation sample M are determined in this manner.

Thus, the values for the transmittance reduction rate [a] and critical elapsed time [tm] obtained for the calibration sample can be treated as those for the evaluation sample because the parameters for the transmittance reduction rate [a] and critical elapsed time [tm] are the same if the sample material and thickness are equivalent. Consequently, if the transmittance is measured for the evaluation sample M within a prescribed time period during which a constant rate of reduction in transmittance is maintained (corresponding to the period from completion of cleaning to elapse of the critical elapsed time [tm]) in order to determine the transmittance T for the elapsed time t (<tm), then this transmittance T can be calibrated by converting it to the transmittance Tc for an arbitrarily selected evaluation time tc (<tm) within the aforementioned prescribed time period, using the following formula (1).

$$Tc = T + (t - tc) \times [a] \qquad (1)$$

In formula (1), the transmittance Tc is the transmittance expected if measured for the reference time tc.

The procedure for determining the correction value $K_L$ for the spectrophotometer will now be explained. Calculation of the correction value $K_L$ requires a correcting transmittance measuring apparatus such as described below.

Figure 7:
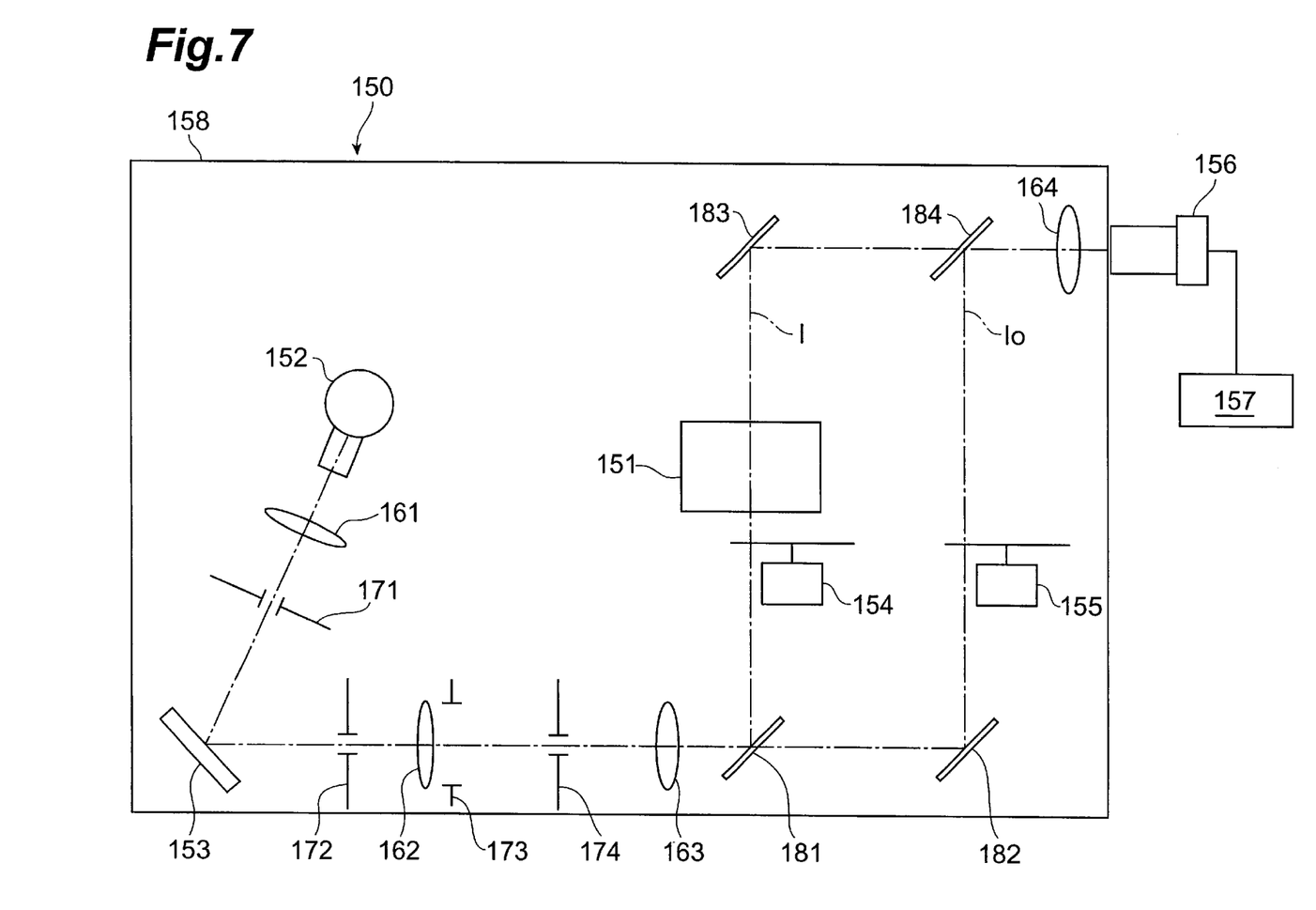
FIG. 7 is a general structural diagram of a correcting transmittance measuring apparatus used for calculation of the correction value $K_L$.

FIG. 7 shows an example of the construction of a correcting transmittance measuring apparatus. In this correcting transmittance measuring apparatus 150, light (ultraviolet light) irradiated from a light source 152 is condensed by a first condensing lens 161 and then enters a diffraction grating 153 through a spectroscope entrance slit 171. The beam which is reflected and diffracted at the diffraction grating 153 is irradiated toward a second condensing lens 162 through a spectroscope exit slit 172, where it is again condensed and its brightness adjusted by a diaphragm 173. The beam passing through the diaphragm 173 is shaped to a prescribed shape by a pinhole 174 and then converted to a parallel beam with a collimator lens 163 and irradiated onto a first half-mirror 181.

The light reflected at the first half-mirror 181 is irradiated onto an object 151 through an optical chopper 154 for the measuring beam. The transmitted beam that has passed through the object 151 is irradiated onto a detector 156 through a mirror 183, a second half-mirror 184 and a condensing lens 164. Meanwhile, the reference beam that has passed through the first half-mirror 181 is irradiated onto the second half-mirror 184 through a first mirror 182 and an optical chopper 155 for the reference beam, and the reference beam reflected at the second half-mirror 184 is irradiated onto the detector 156 through the condensing lens 164. The transmitted beam and the reference beam received at the detector 156 are separated by a processor 157 and the transmitted beam intensity I and reference beam intensity Io are determined. The ratio I/Io of the reference beam intensity Io and the transmitted beam intensity I is used to calculate the transmittance. All the members of the apparatus except for the detector 156 and the processor 157 are sealed in a vacuum chamber 158 and the atmosphere surrounding the measuring beam is adjusted to produce a nearly vacuum pressure.

By varying the slit width of the spectroscope entrance slit 171 and spectroscope exit slit 172 and the hole diameter of the pinhole 174 and moving the second condensing lens 162, the diaphragm 173, the pinhole 174 and the collimator lens 163 along the optical axis, it is possible to adjust the angle of divergence of the measuring beam at the position at which it passes through the object 151. The angle of divergence is adjusted to under 10 milliradians (0.57°). This is to reduce variation in the measuring optical path due to refraction by the object 151, thereby preventing measuring errors caused by uneven sensitivity on the reception surface of the detector 156.

The atmosphere surrounding the optical path of the measuring beam is adjusted to an approximate vacuum, i.e., a pressure of no greater than $1 \times 10^{-2}$ Torr (1.33 Pa), or a pressure of no greater than $2 \times 10^{-3}$ Torr (0.27 Pa) as the oxygen partial pressure. This is to reduce the effect of absorption by oxygen molecules within the differential between the optical path length of the transmitted beam and the optical path length of the reference beam due to the thickness of the object 151.

In order to determine the correction value $K_L$ of the spectrophotometer 110 using a correcting transmittance measuring apparatus 150 having the construction described above, first a plurality of correction samples are fabricated of the same material as the calibration sample M (i.e. the same material as the evaluation sample M) but with different thicknesses. One of the correction samples is given the same thickness as the calibration sample M (i.e. the same thickness Lo as the evaluation sample M) (and therefore the calibration sample itself may be used). After cleaning each correction sample, the transmittance T1 of each is measured using a correcting transmittance measuring apparatus 150 before the critical elapsed time [tm] has elapsed (i.e., within the prescribed time period). The transmittance measurement is carried out for each correction sample, with cleaning being followed by transmittance measurement, and the time elapsed during the transmittance measurement (time elapsed from completion of cleaning) is the same for all. This procedure is used because it is usually not possible to complete measurement of transmittance for all of the correction samples before the critical elapsed time [tm] has elapsed (and therefore calibration using formula (1) is not possible). The loss Y of each correction sample is determined from each transmittance T1 obtained in this manner, using the following formula (2).

$$Y = -LN(T1/Tth) \tag{2}$$

Figure 8:
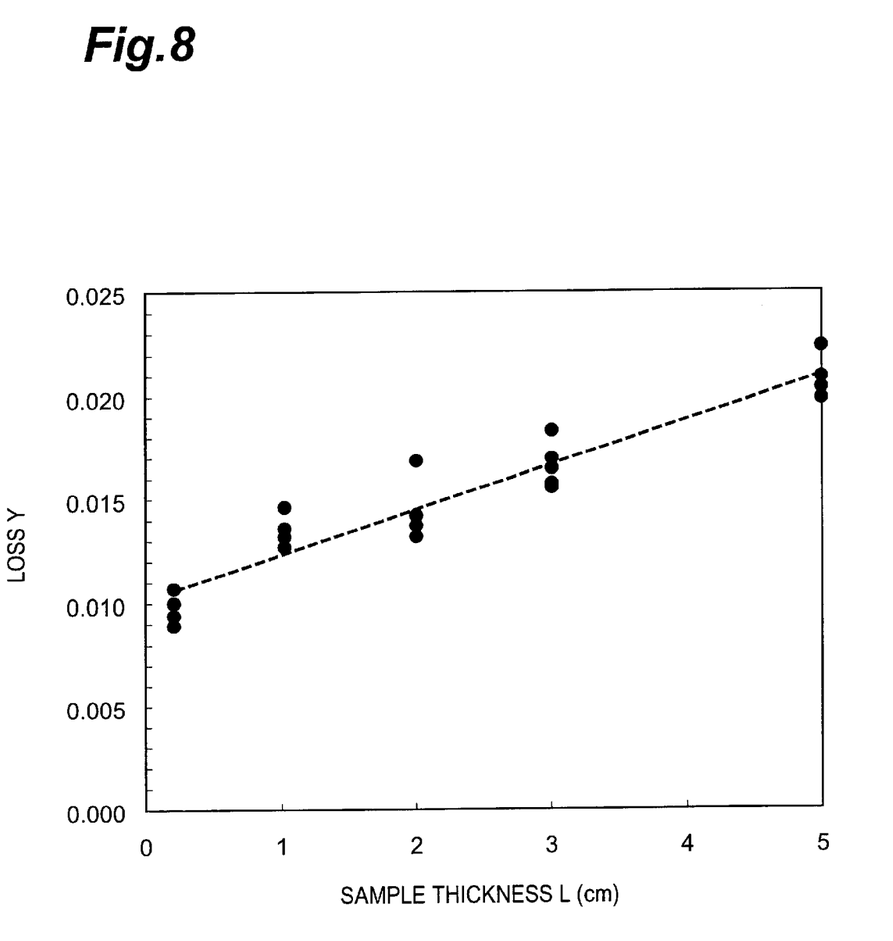
FIG. 8 is a graph showing an example of the sample thickness dependency of loss of a correction sample.

In formula (2), Tth is the theoretical transmittance unique to the material of the correction sample. Once the relationship between the sample thickness L and the loss Y has been obtained using formula (2), the results are plotted on a coordinate graph with sample thickness L on the horizontal axis and loss Y on the vertical axis, to prepare a second plot graph. The plot sequence represented by the second plot graph can be fitted to a line (as shown in FIG. 8, for example). The line inclines gradually as the sample thickness L increases (i.e. it has a positive slope). The slope of the line is calculated as the internal loss coefficient $\beta$ (/cm) of the correction sample.

The transmittance To of each correction sample is expressed by the following formula (3), using the internal loss coefficient $\beta$ (/cm) and the sample thickness L (cm) obtained by the procedure described above.

$$To = Tth \times \exp(-\beta \times L) \tag{3}$$

It is assumed that the difference from the true value due to measuring error, i.e. insufficient measuring precision of the spectrophotometer 110, can be removed if the transmittance Tc at reference time tc obtained from formula (1) is multiplied by the correction value $K_L$, giving the following formula (4).

$$To = K_L \times Tc \tag{4}$$

The following formula (5) is then obtained by combining formula (3) and formula (4).

$$K_L = (Tth/Tc) \times \exp(-\beta \times L) \tag{5}$$

Here, $K_L$ is calculated by determining the value of the transmittance Tc corresponding to the reference time tc based on the line used earlier for fitting in the first plot graph, and plugging in the already determined internal loss coefficient $\beta$ and calibration sample thickness (=Lo) into formula (5).

This calculation gives the correction value $K_L$ for the spectrophotometer 110 corresponding to the material and thickness (=Lo) of the evaluation sample M.

Once both parameters, the transmittance reduction rate [a] and critical elapsed time [tm] corresponding to the material and thickness (=Lo) of the evaluation sample M, and the correction value $K_L$ for the spectrophotometer have been obtained in the manner described above, it is possible to calculate the transmittance (true transmittance To) for the evaluation sample M according to the first to fourth steps shown in FIG. 4. This will now be explained.

In order to determine the transmittance (true transmittance) To of the evaluation sample M, first the evaluation sample M is cleaned (including a drying step) (first step), as shown in FIG. 4. When cleaning is completed, the evaluation sample M is placed in the spectrophotometer 110 and the transmittance is measured within the prescribed time established from the critical elapsed time [tm] which is already known from the previous process, to determine the transmittance T (second step). The cleaned evaluation sample M is placed and held in a dessicator, and removed from the dessicator only when measuring the transmittance. (The same applies when a plurality of evaluation samples are used.) Once the transmittance T has been determined, the value for the elapsed time [t] at the time of measurement of the transmittance T and the value for the transmittance reduction rate [a] are plugged into formula (1), to obtain the transmittance Tc for the reference time tc (third step). Once the standard transmittance Tc has been determined, the correction value $K_L$ which is known from the previous process is used for correction by formula (4), to obtain the true transmittance To (fourth step).

By obtaining the true transmittance To in this manner, it is possible to calculate the internal loss coefficient β for the evaluation sample M by the following formula (6) obtained by modifying formula (3).

$$\beta = -LN(To/Tth)/L \quad (6)$$

The loss coefficient of each of the synthetic silica glass members before ultraviolet irradiation is measured by this procedure, and those with a value of no greater than 0.0020 cm$^{-1}$ are selected.

The synthetic silica glass obtained in this manner having a hydrogen molecule concentration of $1\times10^{16}$ molecules/cm$^3$ to $2\times10^{18}$ molecules/cm$^3$ and a loss factor of no greater than 0.0020 cm$^{-1}$ before ultraviolet irradiation will usually have a loss factor of no greater than 0.0050 cm$^{-1}$ at 193.4 nm as measured after irradiation with an ArF excimer laser with $1\times10^4$ pulse irradiation at an energy density from 0.1 μJ/cm$^2$·p to 200 mJ/cm$^2$·p.

The loss factor at 193.4 nm to be measured after irradiation is then measured during irradiation using a transmittance measuring apparatus. First, from among the synthetic silica glass members having a hydrogen molecule concentration of $1\times10^{16}$ molecules/cm$^3$ to $2\times10^{18}$ molecules/cm$^3$ and a loss factor of no greater than 0.0020 cm$^{-1}$ before ultraviolet irradiation there are formed several groups, with each group consisting of glass members obtained from the same position of the ingot and having equivalent optical properties. One synthetic silica glass member is then taken from one group at random and the loss coefficient at 193.4 nm is measured after irradiation with an ArF excimer laser with $1\times10^4$ pulse irradiation at an energy density from 0.1 μJ/cm$^2$·p to 200 mJ/cm$^2$·p. If the measured loss coefficient of the synthetic silica glass member at 193.4 nm is no greater than 0.0050 cm$^{-1}$, then the synthetic silica glass members of the same group as this synthetic silica glass member that have not been irradiated with the ArF excimer laser are selected as the synthetic silica glass members to be used in the optical system construction step described below.

Thus, synthetic silica glass members satisfying the conditions of a loss factor of no greater than 0.0020 cm$^{-1}$ before ultraviolet irradiation and a loss factor of no greater than 0.0050 cm$^{-1}$ at 193.4 nm are selected in the loss factor measuring step.

In the optical system constructing step, the synthetic silica glass members satisfying these conditions are used to construct at least one from among the synthetic silica glass members for the illumination optical system, the synthetic silica glass members for the projection optical system and the reticle, thereby completing the stepper 1.

Thus, since all or some of the optical members such as lenses of the stepper 1 are synthetic silica glass members with the properties described above, the transmittance of the apparatus as a whole is sufficiently high enough for practical use even when the light source 11 has a short wavelength of under 200 nm such as is typical of an ArF excimer laser. Needless to mention, high transmittance sufficient for practical use is guaranteed even if the light source 11 of the stepper is replaced with one that irradiates light of a longer wavelength than an ArF excimer laser.

The present invention will now be explained in greater detail by way of the following examples and comparative examples, with the understanding that the invention is in no way limited to these examples.

First, the aforementioned synthetic silica glass production apparatus 50 was used to produce five different synthetic silica glass ingots, varying the synthesis conditions such as the raw material flow and the oxygen gas/hydrogen gas flow ratio. The shape of the ingot is usually 180φ to 620φ (φ: diameter in mm)×600–1200 t (t: thickness in mm), and heat treatment is generally carried out with the ingot cut into a block shape with t of 50–300 mm perpendicular to the direction of growth.

As the heat treatment conditions, the ingots were held at 1000° C. for 10 hours, the temperature was then lowered to below 500° C. at a temperature lowering rate of no more than 10° C./hour, and they were subsequently allowed to cool. A lump with a shape of φ=60 mm, thickness=10 mm is then cut out from each ingot and subjected to fine polishing to obtain 12 evaluation samples (synthetic silica glass members).

After calculating the transmittance of each of these 12 evaluation samples before irradiation according to the method described above, the average hydrogen molecule concentration of each sample was measured by Raman spectroscopy. Specifically, the Raman scattering intensity at 800 cm$^{-1}$ and 4135 cm$^{-1}$ was measured according to V. S. Khotimchenko et al., J. Appl. Spectrosc., 46, 632–635 (1987), and the luminous intensity was determined. An ArF excimer laser was then used for $1\times10^4$ pulse irradiation at various energy density values between 0.1 μJ/cm$^2$·p and 200 mJ/cm$^2$·p, and the transmittance at 193.4 nm wavelength after irradiation was determined. After determining the transmittance for each sample, formula (6) was used to calculate the loss coefficients of the samples after ArF excimer laser irradiation. The theoretical transmittance used for formula (6) was 90.8748(%), as the value for synthetic silica glass at 193.4 wavelength.

For some of the samples (Examples 5 and 9), the variation width V of the hydrogen molecule concentration values of the samples in the radial direction, as explained above, was also determined.

The loss coefficients of the 12 evaluation samples before and after ArF excimer laser irradiation were calculated. The results are shown in Table 1. Nine of the 12 evaluation samples which satisfied the conditions of a loss factor of no greater than 0.0020 cm$^{-1}$ before ultraviolet irradiation and an average loss factor of no greater than 0.0050 cm$^{-1}$ after irradiation at 193.4 nm are listed in Table 1 as Examples 1 to 9. The remaining three evaluation samples that did not satisfy these conditions are listed in Table 1 as Comparative Examples 1 to 3.

Figure 9:
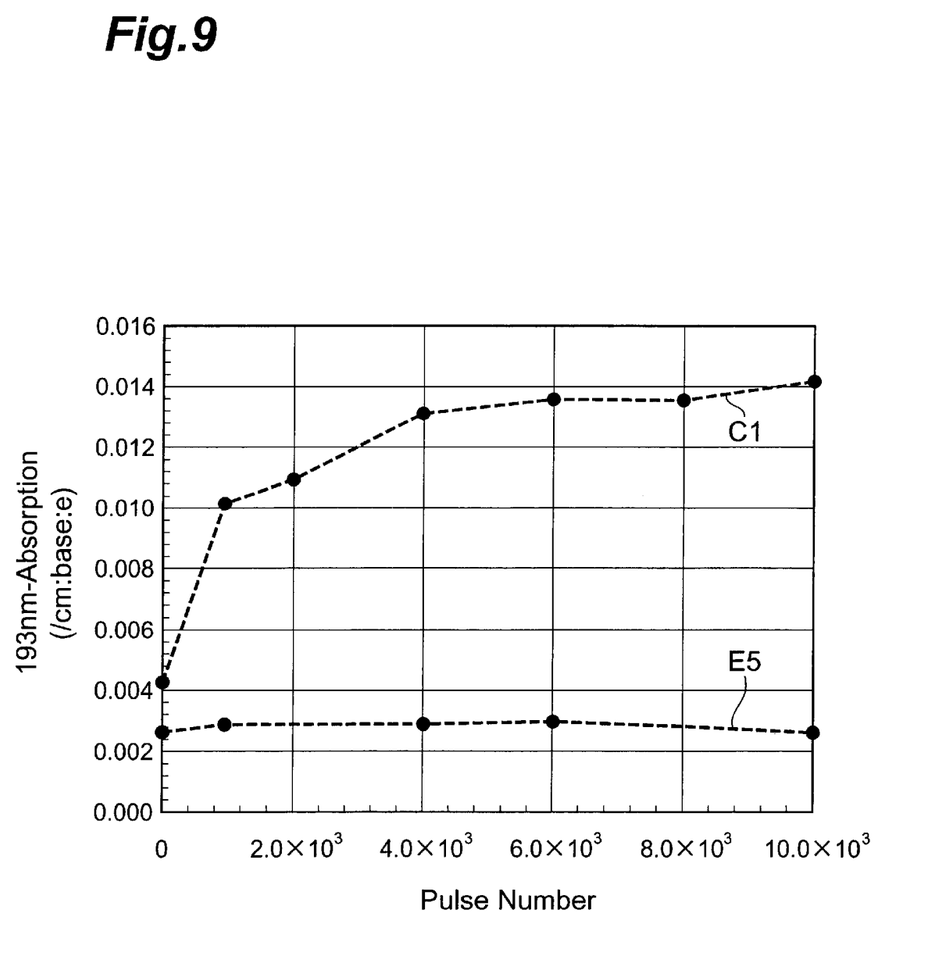
FIG. 9 is a graph showing variation in the loss factor with respect to the irradiation pulse number for samples corresponding to Example 5 and Comparative Example 1.
Figure 10:
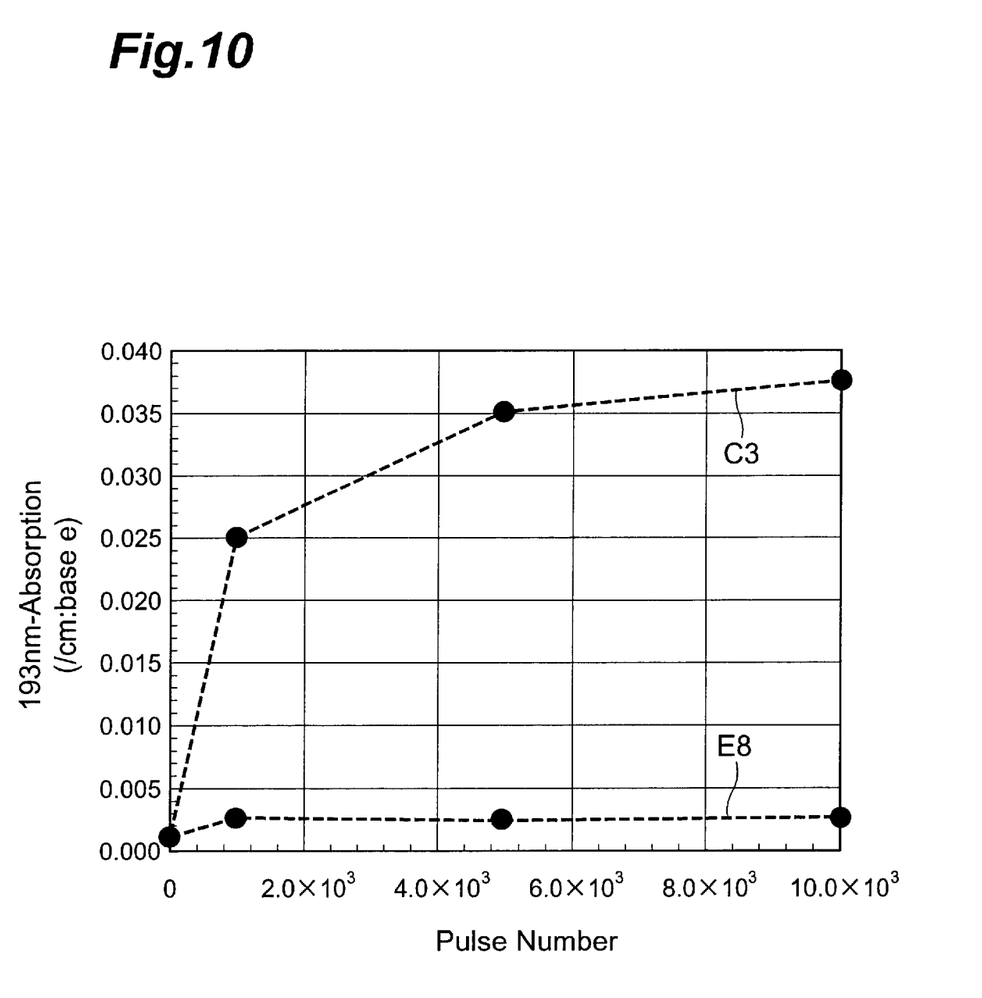
FIG. 10 is a graph showing variation in the loss factor with respect to the irradiation pulse number for samples corresponding to Example 8 and Comparative Example 3.

FIG. 9 shows variation in the loss factor with respect to the irradiation pulse number for irradiation of Example 5 and Comparative Example 1 with an ArF excimer laser at an energy density of 2 mJ/cm$^2$·p. FIG. 10 shows variation in the loss factor with respect to the irradiation pulse number for irradiation of Example 8 and Comparative Example 3 with an ArF excimer laser at an energy density of 200 mJ/cm$^2$·p.

TABLE 1

| | Raw material flow (g/min) | (Oxygen gas)/ (Hydrogen gas) flow ratio | Heat treatment | Loss factor before irradiation (/cm$^{-1}$) | Average hydrogen concentration (molecules/cm$^3$) | ArF irradiation energy density (mJ/cm$^2 \cdot$ p) | Average loss factor after irradiation [initial irradiation absorption] (/cm$^{-1}$) | Score |
|---|---|---|---|---|---|---|---|---|
| Example 1 | 30 | 0.385 | yes | 0.0016 | $1.6 \times 10^{18}$ | 0.2 | 0.00078 | 4 |
| Example 2 | 30 | 0.385 | yes | 0.0013 | $1.6 \times 10^{18}$ | 0.5 | 0.0018 | 4 |
| Example 3 | 30 | 0.382 | yes | 0.0015 | $1.1 \times 10^{18}$ | 0.7 | 0.0014 | 4 |
| Example 4 | 30 | 0.385 | yes | 0.0011 | $1.6 \times 10^{18}$ | 1 | 0.0025 | 4 |
| Example 5 | 30 | 0.378 | yes | 0.0016 | $1.8 \times 10^{18}$ [variation width V: $-20\% \leq V \leq +20\%$] | 2 | 0.0025 [0.0022 – 0.0032] | 4 |
| Example 6 | 30 | 0.385 | yes | 0.0014 | $1.6 \times 10^{18}$ | 10 | 0.005 | 4 |
| Example 7 | 30 | 0.386 | yes | 0.0014 | $1.5 \times 10^{18}$ | 100 | 0.0025 | 4 |
| Example 8 | 30 | 0.388 | yes | 0.0012 | $9.8 \times 10^{17}$ | 200 | 0.0025 | 4 |
| Example 9 | 30 | 0.378 | yes | 0.0016 | $1.8 \times 10^{18}$ [variation width V: $-60\% \leq V \leq +60\%$] | 2 | 0.005 [0.0075 – 0.0010] | 3 |
| Comp. Ex. 1 | 45 | 0.246 | no | 0.0043 | $5 \times 10^{18}$ | 2 | 0.0142 | 0 |
| Comp. Ex. 2 | 45 | 0.246 | yes | 0.0047 | $5 \times 10^{18}$ | 200 | 0.0057 | 0 |
| Comp. Ex. 3 | 60 | 0.355 | no | 0.0011 | $6 \times 10^{18}$ | 200 | 0.0375 | 1 |

From Table 1 it was confirmed that for all of the samples having a hydrogen molecule concentration of $1 \times 10^{16}$ molecules/cm$^3$ to $2 \times 10^{18}$ molecules/cm$^3$ and a loss factor of no greater than 0.0020 cm$^{-1}$ before ultraviolet irradiation, the variation width V of the hydrogen molecule concentration was in the range of $-50\% \leq V \leq +50\%$, and the loss factors after irradiation with the ArF excimer laser were no greater than 0.005 cm$^{-1}$.

When a plurality of samples having hydrogen molecule concentrations and loss factors before and after irradiation that were equivalent to those exhibited by the examples were mounted at synthetic silica glass sections of the illumination optical system and projection optical system of a stepper having the same construction as the aforementioned stepper 1, the necessary resolution of 0.13 μm was obtained, thus confirming satisfactory performance for practical use.

It was also judged whether or not the stepper exhibits satisfactory performance for practical use. One point was assigned for a hydrogen molecule concentration of $1 \times 10^{16}$ molecules/cm$^3$ to $2 \times 10^{18}$ molecules/cm$^3$, one point was assigned for a hydrogen molecule concentration value variation width V in the range of $-50\% \leq V \leq +50\%$, one point was assigned for a loss factor of no greater than 0.0020 cm$^{-1}$ before ultraviolet irradiation and one point was assigned for an average loss factor at 193.4 nm of no greater than 0.0050 cm$^{-1}$ after $1 \times 10^4$ pulse irradiation with an ArF excimer laser, and the total points were summed. The results of the total sum are shown in Table 1. A stepper with a total sum of three or more points exhibits satisfactory performance for practical use as a stepper. The hydrogen molecule concentration value variation widths V of the samples of Examples 1 to 8 (all except Example 9) were in the range of $-50\% \leq V \leq +50\%$. The hydrogen molecule concentration value variation widths V of the samples of Comparative Examples 1 to 3 were all in a range larger than the range of $-50\% \leq V \leq +50\%$.

As confirmed by this mounting in steppers, Examples 1 to 9 which had loss factors (initial irradiation absorption) of no greater than 0.0050 cm$^{-1}$ after ArF excimer laser irradiation at $1 \times 10^4$ pulses exhibited performance suitable for practical use, while Comparative Examples 1 to 3 which had loss factors of greater than 0.0050 cm$^{-1}$ after ArF excimer laser irradiation did not exhibit performance suitable for practical use. It was confirmed that those with an average hydrogen molecule concentration of $5 \times 10^{18}$/cm$^3$ or greater as in Comparative Example 3 have a large hydrogen molecule concentration value variation width and a very large loss coefficient after $1 \times 10^4$ pulse irradiation with an ArF excimer laser.

The hydrogen molecule concentration values of the sample of Example 5 in the radial direction were distributed in a narrow range of $1.4 \times 10^{18}$–$2.2 \times 10^{18}$ molecules/cm$^3$, and the hydrogen molecule concentration value variation width V was $-20\% \leq V \leq +20\%$. The hydrogen molecule concentration values of the sample of Example 9 in the radial direction were distributed in a narrow range within $0.76 \times 10^{18}$–$2.9 \times 10^{18}$ molecules/cm$^3$, and the hydrogen molecule concentration value variation width V was $-60\% \leq V \leq +60\%$.

As explained above, the synthetic silica glass members of the invention have properties such that, upon $1 \times 10^4$ pulse irradiation with an ArF excimer laser at an energy density from 0.1 μJ/cm$^2 \cdot$p to 200 mJ/cm$^2 \cdot$p, the loss factor at 193.4 nm measured after irradiation is no greater than 0.0050 cm$^{-1}$, and by using such synthetic silica glass for construction of all or some of the optical members of a photolithography apparatus it is possible to increase the transmittance of the photolithography apparatus to exhibit adequate performance for practical use even when the light source used is an ArF excimer laser.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A synthetic silica glass member for use in a photolithography apparatus employing light in a wavelength range of 400 nm or less, wherein
    upon $1 \times 10^4$ pulse irradiation with an ArF excimer laser at an energy density from 0.1 μJ/cm$^2 \cdot$p to 200 mJ/cm$^2 \cdot$p, the loss factor at 193.4 nm measured after irradiation is no greater than 0.0050 cm$^{-1}$, the hydrogen molecule concentration is from $1 \times 10^{16}$ molecules/cm$^3$ to $1.8 \times 10^{18}$ molecules/cm$^3$, wherein for the hydrogen molecule concentration at the geometrical center of gravity of the synthetic silica glass member, the variation width V of the hydrogen molecule concentration at any desired point on a plane including the center is in the range of $-50\% \leq V \leq +50\%$, and the loss factor before ultraviolet irradiation is no greater than 0.0020 cm$^{-1}$.

2. A photolithography apparatus comprising an exposure light source that emits light with a wavelength of 400 nm or less as the exposure light, a reticle with a pattern image formed therein, an illumination optical system that irradiates light outputted from said exposure light source onto said reticle, a projection optical system that projects the pattern image outputted from said reticle onto a photosensitive plate and an alignment system that positions said reticle and said photosensitive plate, wherein at least some of the synthetic silica glass members composing said illumination optical system, the synthetic silica glass members composing said projection optical system and said reticle consist of synthetic silica glass members according to claim 1.

3. A process for producing a photolithography apparatus which comprises an exposure light source that emits light with a wavelength of 400 nm or less as the exposure light, a reticle with a pattern image formed therein, an illumination optical system that irradiates light outputted from said exposure light source onto said reticle, a projection optical system that projects the pattern image outputted from said reticle onto a photosensitive plate and an alignment system that positions said reticle and said photosensitive plate, the process comprising:

an ingot synthesizing step in which a synthetic silica glass ingot with a hydrogen molecule concentration of from $1 \times 10^{16}$ molecules/cm$^3$ to $1.8 \times 10^{18}$ molecules/cm$^3$ is synthesized, wherein for the hydrogen molecule concentration at the geometrical center of gravity of the synthetic silica glass member, the variation width V of the hydrogen molecule concentration at any desired point on a plane including the center is in the range of $-50\% \leq V \leq +50\%$, an ingot cutting step in which said synthetic silica glass ingot is cut to obtain a synthetic silica glass member of the prescribed shape and size, a loss factor measuring step for measurement of the loss factor of said synthetic silica glass member before ultraviolet irradiation and the loss factor at 193.4 nm after irradiation with an ArF excimer laser with $1 \times 10^4$ pulse irradiation at an energy density from 0.1 $\mu$J/cm$^2 \cdot$p to 200 mJ/cm$^2 \cdot$p, to obtain a synthetic silica glass member with a loss factor of no greater than 0.0020 cm$^{-1}$ before said ultraviolet irradiation and a loss factor of no greater than 0.0050 cm$^{-1}$ at 193.4 nm, and an optical system constructing step in which the synthetic silica glass member obtained in said loss factor measuring step is used to construct at least some of the synthetic silica glass members composing said illumination optical system, the synthetic silica glass members composing said projection optical system and said reticle.

* * * * *